United States Patent [19]

Shiraiwa

[11] Patent Number: 5,273,423
[45] Date of Patent: Dec. 28, 1993

[54] HEAT TREATMENT APPARATUS

[75] Inventor: Hirotsugu Shiraiwa, Hino, Japan

[73] Assignee: Tokyo Electron Sagami Kabushiki Kaisha, Kanagawa, Japan

[21] Appl. No.: 886,873

[22] Filed: May 22, 1992

[30] Foreign Application Priority Data

May 30, 1991 [JP] Japan .................. 3-155204

[51] Int. Cl.$^5$ ............................ F27D 5/00; F27B 9/00
[52] U.S. Cl. .................................. 432/241; 432/2; 432/152; 432/253
[58] Field of Search ............ 432/5, 6, 2, 152, 253, 432/241; 454/187, 296

[56] References Cited

U.S. PATENT DOCUMENTS

| | | | |
|---|---|---|---|
| 2,988,980 | 6/1961 | Tschudin | 454/296 |
| 4,610,628 | 9/1986 | Mizushina | 432/241 |
| 4,876,949 | 10/1989 | Fairchild et al. | 454/296 |
| 4,949,262 | 5/1990 | Balon, Jr. et al. | 454/296 |
| 5,118,286 | 6/1992 | Sarin | 432/2 |

Primary Examiner—Henry C. Yuen
Attorney, Agent, or Firm—Beveridge, DeGrandi, Weilacher & Young

[57] ABSTRACT

A heat treatment apparatus includes a process tube for heat treatment of an object to be heat treated, and a load lock chamber linked to the process tube and for housing the object to be heat treated and maintaining either a vacuum or maintaining an arbitrary inert gas atmosphere, and with the load lock chamber being provided with an elevator for raising the object to be heat treated on a loading mechanism and into the process tube, and a nozzle unit provided with a plural number of gas emission openings in an inner wall of the load lock chamber on a side opposing the elevator, and to uniformly emit gas to the object to be heat treated and which is on the loading mechanism. By such a configuration, it is possible to emit gas uniformly to the object for heat treatment and which is on the loading mechanism for the object for heat treatment.

13 Claims, 8 Drawing Sheets

HEAT TREATMENT APPARATUS

BACKGROUND OF THE INVENTION

The present invention relates to a heat treatment apparatus used in heat treatment of semiconductor devices, for example semiconductor wafers, and other devices which require heat treatment thereon.

FIG. 11 is a longitudinal sectional view of one portion of a typical heat treatment apparatus used in the manufacture of semiconductor devices, and oxidation, CVD and other processing for the heat treatment of semiconductor wafers. This heat treatment apparatus is provided with a heater chamber 1 which houses a process tube 4 which is the processing chamber which implements required processing such as heat treatment to the wafers 2 which are the objects for heat treatment, and beneath this process tube is provided a load lock chamber 8 via a manifold 6.

This manifold 6 is an empty space for coupling the process tube 4 and the load chamber 8. In addition, it is a shutout and standby space which separates the wafers 2 from the external air either prior to or after processing of the wafers 2 in the process tube 4.

The process tube 4 is a cylindrical body from a heat resistant material such as glass or the like which has one end sealed, and which does not exert any influence with respect to the object of heat treatment. A processing furnace in which a process tube such as this is housed vertically is called a vertical type furnace.

Around the periphery of this process tube 4 is a heater 10 for performing the necessary heat treatment with respect to the wafer 2. This heater 10 is connected to a heat control apparatus (not shown) so as to perform electrical heat control.

Moreover, the treatment temperature of the process tube 4 is set to 500°-1000° C. in the case of CVD processing, or to 800°-1200° C. with oxidation processing and dispersion processing.

In addition, to the manifold 6 provided to the lower end side of the process tube 4 is provided a gas introduction tube 12 for the introduction of the processing gas $G_1$ into the process tube 4 in accordance with the processing of the object to be heat treated, and this gas introduction tube 12 is connected via a control valve and the like to a treatment gas source (not shown).

For example, the $SiH_4$ used as the processing gas in CVD processing for the formation of a polysilicon film or the $NH_4$ or $SiH_2Cl_2$ gas used when there is the formation of a silicon nitride film, is introduced into the process tube 4 via the gas introduction tube 12. In addition, the treatment gas for purging the inside of the process tube 4 is $N_2$ gas for example which is introduced from the gas introduction tube 12.

Inside this process tube 4 is provided a cylindrical partition wall 14 formed by glass or some other heat resistant material. The treatment gas $G_1$ introduced from the gas introduction tube 12 drops from the top to the bottom from the side of the manifold 6 to the inner side of the cylindrical partition wall 14 and then rises on the outer side of the cylindrical partition wall 14 to return again to the manifold 6. More specifically, on the outer side portion of the cylindrical partition wall 14, the manifold 6 is connected to an exhaust pipe 16 which is the exhaust portion for exhausting the air in either the initial status (when there is start) or the treatment gas $G_1$ which has recirculated, and this exhaust tube 16 is connected to a vacuum apparatus (not shown). More specifically, the treatment gas $G_1$ and the air is forcedly exhausted via the vacuum apparatus to outside the process tube 4.

In addition, a wafer boat 18 rises and lowers so that wafers which are the item for treatment are loaded from the side of the load lock chamber 8 to the process tube 4. To an opening portion 19 on the side of the load lock chamber 8 of the manifold 6 is provided a shutter 20 which separates the load lock chamber 8.

This shutter 20 operates to seal the opening portion 19 of the manifold 6 when the wafer boat 18 is unloaded from the process tube 4.

The load lock chamber 8 is provided with a boat elevator 22 as the means of raising and lowering the wafer boat 18 to load and unload the wafer 2 to the process tube 4. To an upper surface of this boat elevator 22 is mounted a heat retention casing 24 to support the wafer boat 18 and form a thermally uniform region thereon. This heat retention casing 24 is formed with a flange 26 as the sealing lid for sealing the opening surface of the manifold 6 when there is the unloading of the wafers 2. More specifically, when there is unloading, the shutter 20 opens and the opening portion 19 is closed by the flange in the manifold 6 and is sealed from the load lock chamber 8.

Also, to the side of the load lock chamber 8 is provided a gate 28 for carrying the wafers 2 in and out prior to and after treatment, and this gate 28 is provided with a gate valve (not shown). The load lock chamber 8 has its side wall portions provided with a gas introduction tube 30 and a gas discharge tube 32.

The gas introduction tube 30 is connected to a gas source for a purge gas $G_2$ which is an inert gas or the like, so that the load lock chamber 8 is filled with a non-oxidizing atmosphere (i.e. an atmosphere free of $O_2$)

More specifically, the inside of the load lock chamber 8 is made a vacuum by exhausting through the gas discharge tube 32 and then the air or the gas $G_2$ supplied through the gas discharge tube 32 is exhausted via the gas discharge tube 32.

However, in such a heat treatment apparatus, after the inside of the load lock chamber 8 has been made either a vacuum or is in a status of reduced pressure, it is necessary to purge the inert gas or the like but the flow of this purge gas $G_2$ exerts an influence upon the wafer treatment speed.

More specifically, the load lock chamber 8 is provided with a boat elevator 22 as the means of transferring the wafers 2 which are to be treated, to the process tube 4, and the mechanism portion (ball screw) 34 of this boat elevator 22 generates dust due to mechanical friction therebetween and the wafers 2 must be protected from this dust. In addition, it is necessary that the purge gas $G_2$ be uniformly applied to the wafers 2 and that there by no wafers portions not exposed to this gas as a result of eddies and the like. Furthermore, the load lock chamber 8 is provided with a boat elevator 22 and the like and so there is the tendency for the size of the entire heat treatment apparatus to increase. However, in order to respond to the requirement for a compact processing space, it is necessary to also reduce the area taken up by the mechanism for the supply of the purge gas.

SUMMARY OF THE INVENTION

The present invention has as an object the provision of a heat treatment apparatus that can efficiently perform the supply of gas to a load lock chamber.

The heat treatment apparatus of the present invention is a heat treatment apparatus provided with a process tube for the heat treatment of an object to be heat treated, and a load lock chamber linked to the process tube and for housing the object to be heat treated and maintaining either a vacuum or maintaining an arbitrary inert atmosphere, and is characterized by being provided with nozzles formed at a distance from a plural number of gas emission opening which emit gas uniformly to the object to be heat treated and which is on a wafer boat inside the load lock chamber.

In this heat treatment apparatus, uniform gas emission from the gas emission openings of the nozzle provided to the load is performed to each wafer loaded on the wafer boat. When compared with the conventional case where gas is supplied from one point, uniform gas emission is performed from the wall surface portion of the load lock chamber, and it is possible to quickly purge the inside of the load lock chamber. In addition, with this nozzle unit, the purge gas is uniformly sent to the wafers from the side of the wall surface of the load lock chamber and so the purge gas is applied uniformly to all of the wafers in the wafer boat, and eddies and the like to not allow areas of gas to stagnate.

DETAILED DESCRIPTION OF THE PREFERRED EMBODIMENT

Figure 1:
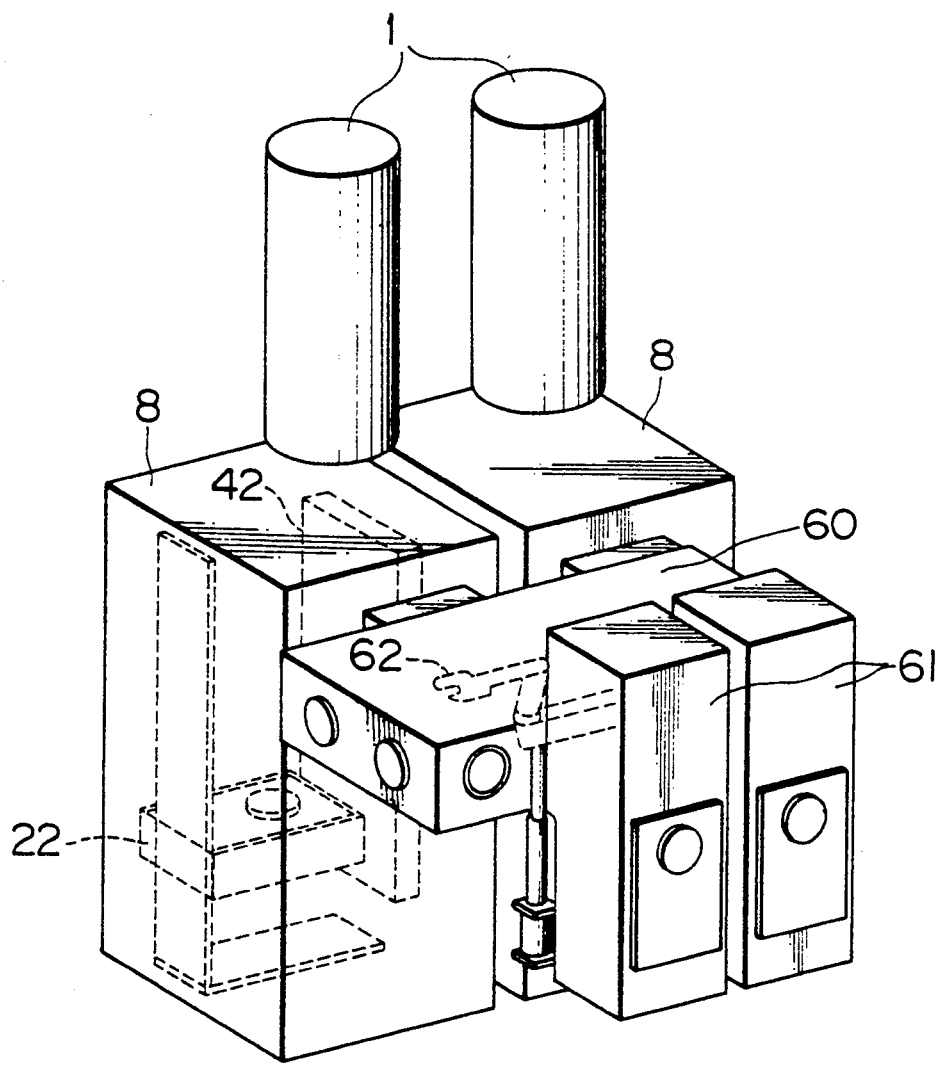
FIG. 1 is a perspective view showing an overall configuration of the heat treatment apparatus of the present invention.
Figure 2:
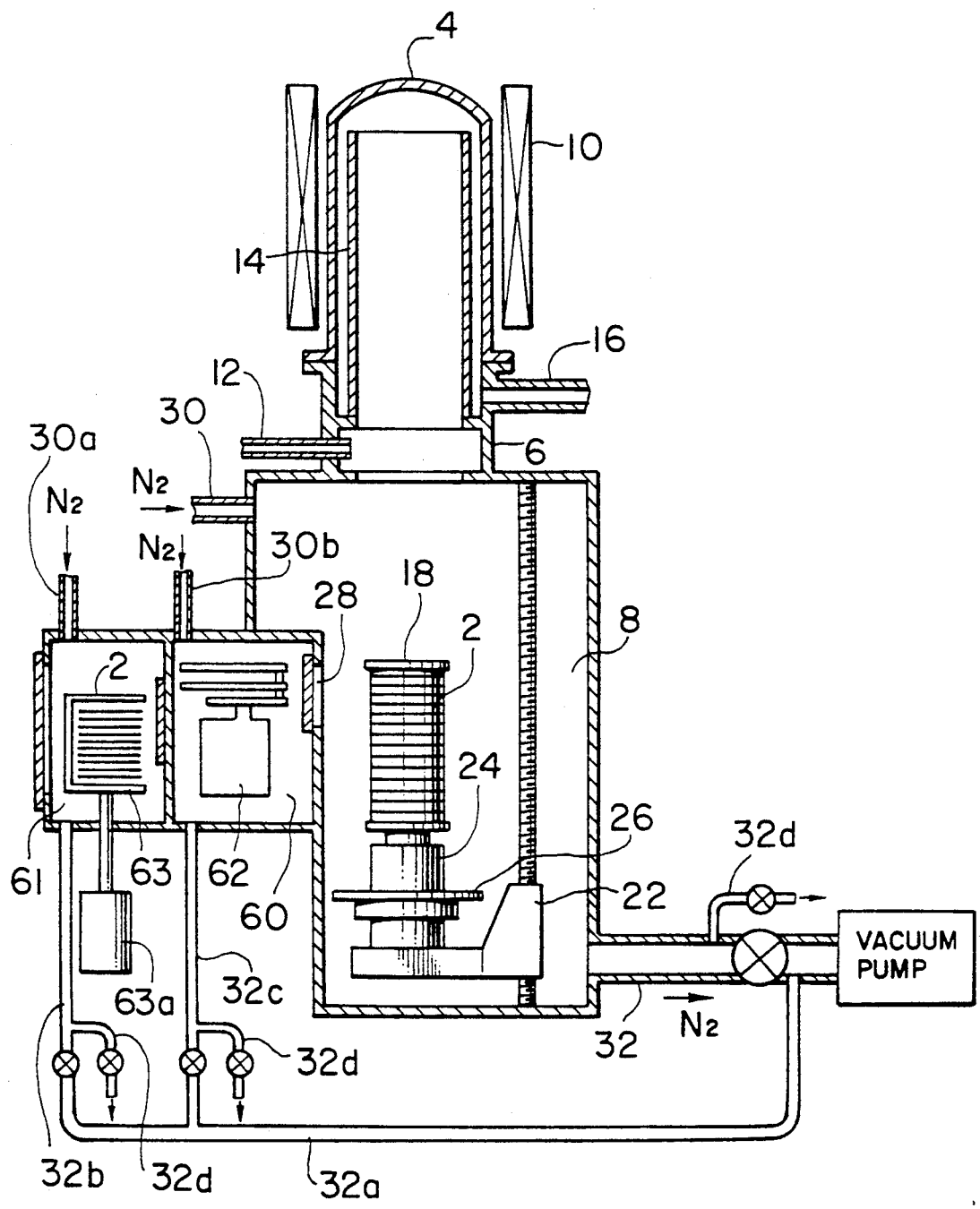
FIG. 2 is a longitudinal sectional view showing an outline configuration of the heat treatment apparatus shown in FIG. 1.

The following is a description of the overall configuration of the heat treatment apparatus of the present invention, with reference to FIG. 1 and FIG. 2.

As shown in FIG. 1, the overall configuration of the vertical type heat treatment apparatus of an embodiment of the present invention comprises a heater chamber 1, a load lock chamber 8, a cassette chamber 61 which stores semiconductor wafers 2 which are the object for heat treatment, and a transfer chamber 60 which is linked to the cassette chamber 61. The nozzle unit 41 of the present invention is provided inside the load lock chamber 8.

In addition, as shown in FIG. 2, to the lower side of the process tube 4 formed of glass or the like, is provided a manifold 6. An exhaust tube 16 and a gas introduction tube 12 provided to this manifold 6 perform the introduction of gas and the exhaust of gas to and from the inside of the process tube 4. In addition, to the inside of the process tube 4 is provided a partition wall 14 and to the outside is provided a heater 10 to wrap around the process tube 4 so that it heat control of the process tube 4 can be performed to a desired temperature.

A wafer boat 18 which houses the many semiconductor wafers loaded to it, is loaded on a heat retention casing 24 and is raised by a boat elevator 22 and is inserted into the process tube 4 from the load lock chamber 8. Here, the configuration is such that when the load lock chamber 8 has been inserted into the process tube 4, the inside of the process tube 4 is airtightly sealed by a flange 26.

In such a heat treatment apparatus, the work of inserting the wafer boat 18 which houses the semiconductor wafers 2 and the work of housing the semiconductor wafers 2 to the wafer boat 18 has to be performed in the status where there is either an atmosphere of $N_2$ gas or some other oxygen-free atmosphere. The reason for this is that if this work is performed in the atmosphere, there will be the formation of a natural oxidation film on the surface of the semiconductor wafers 2 because of the $O_2$ in the atmosphere. Because of this, a conveyor means (robot) 62 which transfers the semiconductor wafers 2 housed in a wafer cassette 63 which is raised by an elevator means 63a, to the wafer boat 18 is arranged inside the transfer chamber 60 which is adjacent to the cassette chamber 61 to and from which $N_2$ gas can be introduced and exhausted.

When heat treatment of semiconductor wafers 2 is performed using a heat treatment apparatus having such a configuration, the semiconductor wafers 2 are first housed in the wafer boat 18 under an atmosphere of $N_2$ gas, and the boat elevator 22 which is the means of conveying the wafer boat 18 rises to insert the wafer boat 18 into the process tube 4. After this, the exhaust tube 16 is used to exhaust the $N_2$ gas from the inside of the process tube 4. When there is a required degree of vacuum inside the process tube 4, the treatment gas is introduced into the manifold 6 from the gas introduction tube 12 and the required heat treatment is performed.

When the heat treatment has been completed, the residual treatment gas is exhausted from inside of the process tube 4 and a vacuum is created. When a required degree of vacuum has been attained inside the process tube 4, the $N_2$ gas from the gas introduction tube 12 is introduced to inside the process tube 4. After this, when the pressure of the $N_2$ gas has become the same as that of the $N_2$ gas inside the load lock chamber 8, the wafer boat 18 is lowered by the boat elevator 22 and the semiconductor wafers 2 are taken from the process tube 4.

In addition, $N_2$ or some other inert gas for purging can be introduced from the gas introduction tube 30 for making the inside of the load lock chamber 8 an oxygen-free atmosphere. In addition, a vacuum is created inside the load lock chamber 8 by a vacuum pump is connected to it via an exhaust tube 32, and the exhausting of the gas or air which is introduced from the gas introduction tube 30 is performed by the exhaust tube 32.

More specifically, the $N_2$ gas which constitutes the $N_2$ gas atmosphere is respectively introduced from a gas introduction tube 30a to the inside of the load lock chamber 8, and from a gas introduction tube 30b to inside the transfer chamber 60, and is always exhausted from exhaust tubes 32, 32b, 32c and 32d.

The following is a description of the operation of the heat treatment apparatus of the present invention.

First, when there is start-up of the apparatus, that is, when there is the status where air (including $O_2$) is filled in each of the chambers, the gates between the cassette chamber 61 and the transfer chamber 60, and between the load lock chamber 8 and the transfer chamber 60 are first closed. Then, the valve between the exhaust tube 32 and the vacuum pump is opened and the vacuum pump is driven to exhaust air from the load lock chamber 8 via the exhaust tube 32 and to create a vacuum therein. After this, the valve between the exhaust tube and the vacuum pump is closed, and $N_2$ gas is introduced into the load lock chamber 8 from the gas introduction tube 30. After the inside of the load lock chamber 8 has reached normal pressure, $N_2$ gas is introduced into the load lock chamber 8 from the gas introduction tube 30 while the valve of the gas exhaust tube 32d is opened and the $N_2$ gas is allowed to escape into the plant exhaust. By this operation, it is possible to hold the inside of the load lock chamber 8 in a status where $N_2$ gas is at normal pressure. Furthermore, the vacuum pump creates a vacuum inside the transfer chamber 60 and via the exhaust tube 32c. After this, the valve between the gas exhaust tubes 32 and 32a is closed and $N_2$ gas is introduced into the transfer chamber 60 from the gas introduction tube 30b. After the inside of the transfer chamber 60 has reached normal pressure, $N_2$ gas is introduced into the transfer chamber 60 from the gas introduction tube 30b, and the valve of the gas exhaust tube 32d is opened and the gas is allowed to escape into the plant exhaust. By this operation, the inside of the transfer chamber 60 is held in a status where $N_2$ gas is at normal pressure.

After the start-up of the apparatus, that is, after there is normal usage, there is the respective introduction of $N_2$ gas into the load lock chamber 8 and the transfer chamber 60 from the gas introduction tubes 30 and 30b while the $N_2$ gas is discharged into the plant exhaust from the gas exhaust tube 32d. After this, the gate of the cassette chamber 61 is opened and the cassette 63 housing the wafer 2 is stored in the cassette chamber 61. The valve between the gas exhaust tubes 32b and 32c is opened and the vacuum pump is used to create a vacuum inside the cassette chamber 61 via the gas exhaust tube 32b. After this, the valves of the gas exhaust tubes 32b and 32c are closed, and $N_2$ gas is introduced into the cassette chamber 61 from the gas introduction tube 30a. After the inside of the cassette chamber 61 has reached normal pressure, $N_2$ gas is introduced from the gas introduction tube 30a, the valve of the gas exhaust tube 32d is opened and the $N_2$ gas is discharged to the plant exhaust. With this operation, the gates between the cassette chamber 61 and the transfer chamber 60, and between the load lock chamber 8 and the transfer chamber 60 are opened, and the wafer cassette 63 is transferred to the wafer boat 18.

In this manner, in the vertical type heat treatment device shown in FIG. 2, it is possible for the semiconductor wafers 2 to be carried into and out of the process tube 4 under an oxygen-free atmosphere of $N_2$ gas or the like and so it is possible to prevent the formation of a natural oxidation film on the surface of the semiconductor wafers 2.

Figure 3:
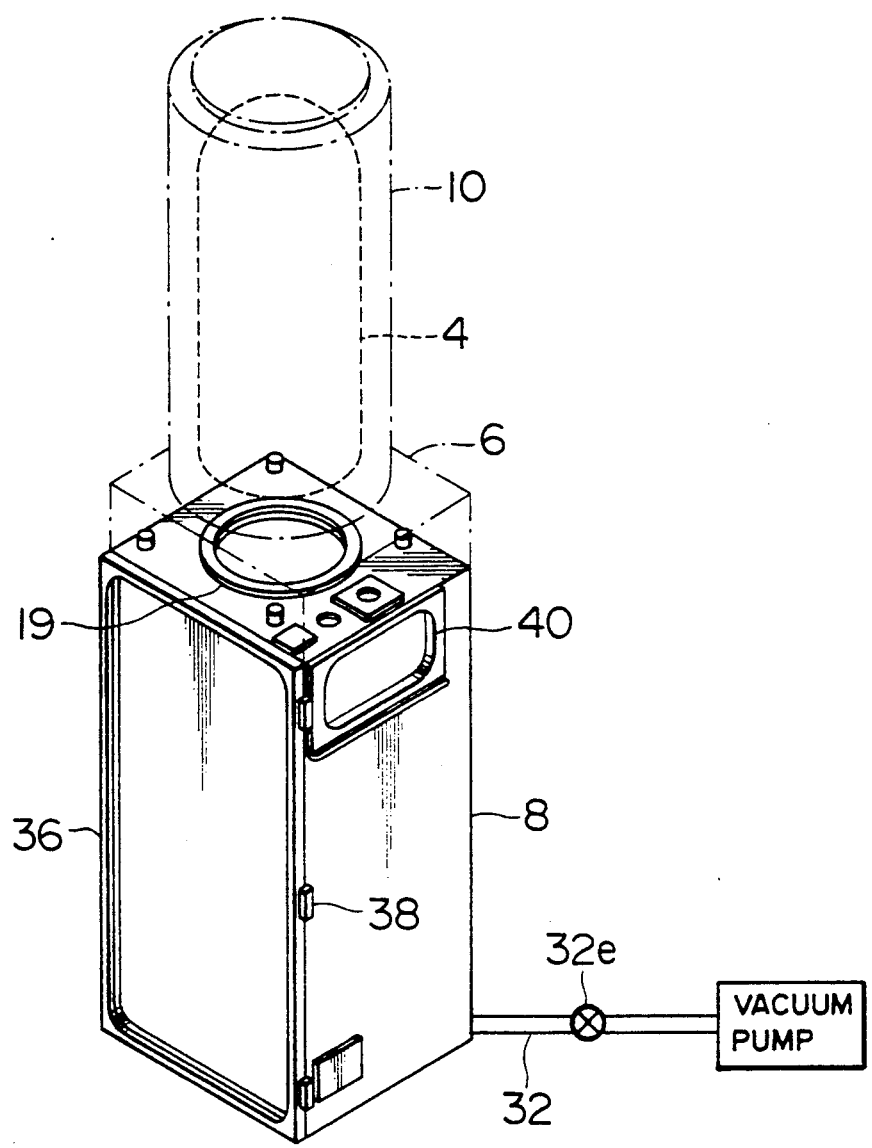
FIG. 3 is a perspective view showing a portion of the load lock chamber and the nozzle unit inside the load lock chamber shown in FIG. 3.
Figure 4:
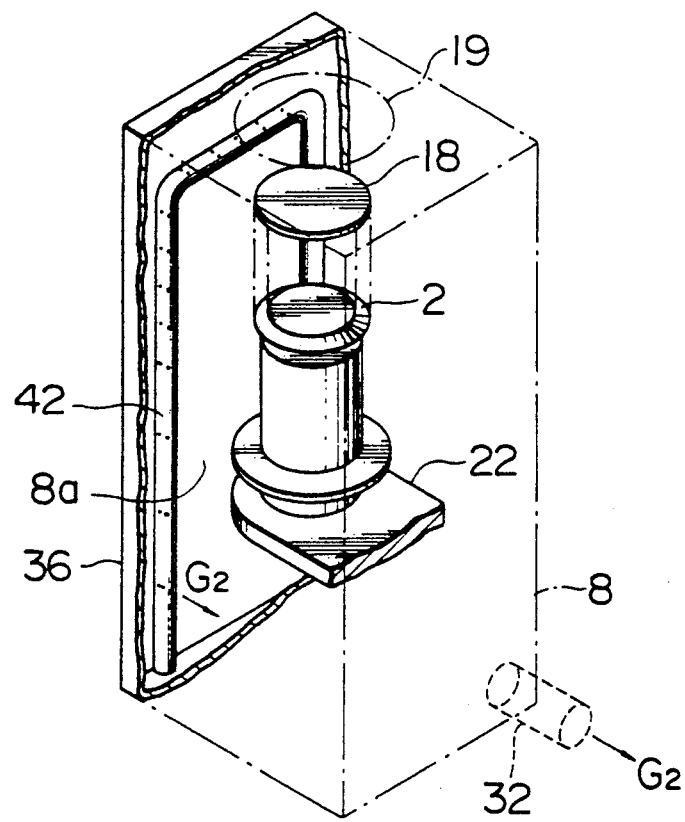
FIG. 4 is a partial sectional perspective view showing the arrangement of the nozzle unit inside the load lock chamber shown in FIG. 4.
Figure 5:
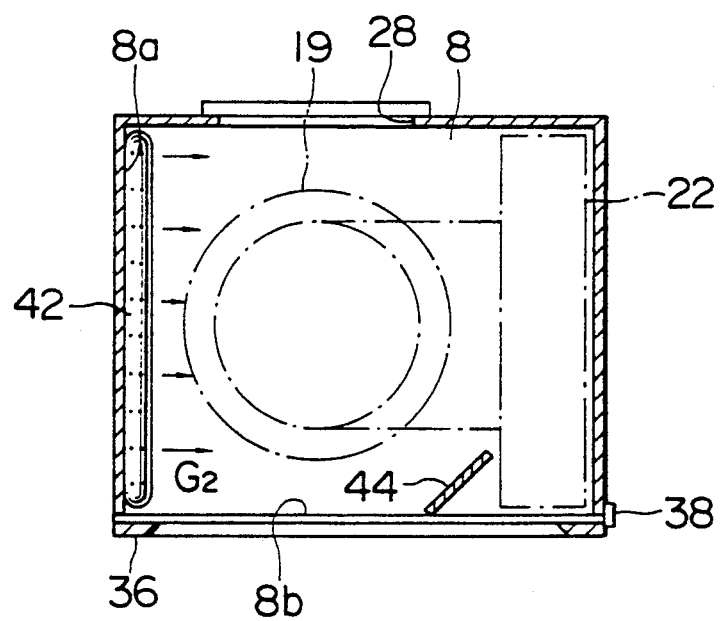
FIG. 5 is a lateral sectional view showing the arrangement of the nozzle unit inside the load lock chamber shown in FIG. 4.

In addition, as shown in from FIGS. 3 through 5, there is a heater 10 provided to the periphery of the process tube 4 which treats the semiconductor wafers 2 which are the object of heat treatment. To the lower side of this process tube 4 is provided a load lock chamber 8 via the manifold 6. This load lock chamber 8 configures an airtight chamber which maintains the semiconductor wafers 2 inside it under a vacuum or an atmosphere of some arbitrary gas.

This load lock chamber 8 maintains a vacuum and so has a pressure-resistant structure, the front surface portion of which has mounted to it a door 36 which is openable and closable via a hinge 38. To the upper surface of this load lock chamber 8 is provided an opening portion 19 which opens into the manifold 6 and the movement of the semiconductor wafers 2 between the load lock chamber 8 and the process tube 4 is performed via this opening portion 19. In addition, to the side surface portion of this load lock chamber 8 is formed a transparent window 40 of a transparent material airtightly formed and so as to enable the observation of the inside of the load lock chamber 8.

Then, the load lock chamber 8 is connected to a vacuum pump via the exhaust tube 32 and a gate valve 32e.

As shown in FIG. 4 and FIG. 5, to the inside of the load lock chamber 8 is provided a boat elevator 22 which is the means of raising and lowering the wafer boat 18 along with the semiconductor wafers 2 which are to be processed. In addition, an inner wall surface 8a opposing the boat elevator 22 of the load lock chamber 8 has a nozzle unit 42 provided so as to avoid the space for the movement of the boat elevator 22, and which supplies the purge gas $G_2$ to the surface of the semiconductor wafers 2. In addition, a reflector 44 is provided to a side wall surface 8b of the load lock chamber 8 on the side of the boat elevator 22 and so as to direct the flow of the purge gas $G_2$ supplied from this nozzle unit 42. When this occurs, the purge gas is for example, $N_2$ gas supplied for wafer cooling at a rate of 40 l./min, or normally, at 20 l./min.

The following is a description of an embodiment of the nozzle unit 42.

Figure 6:
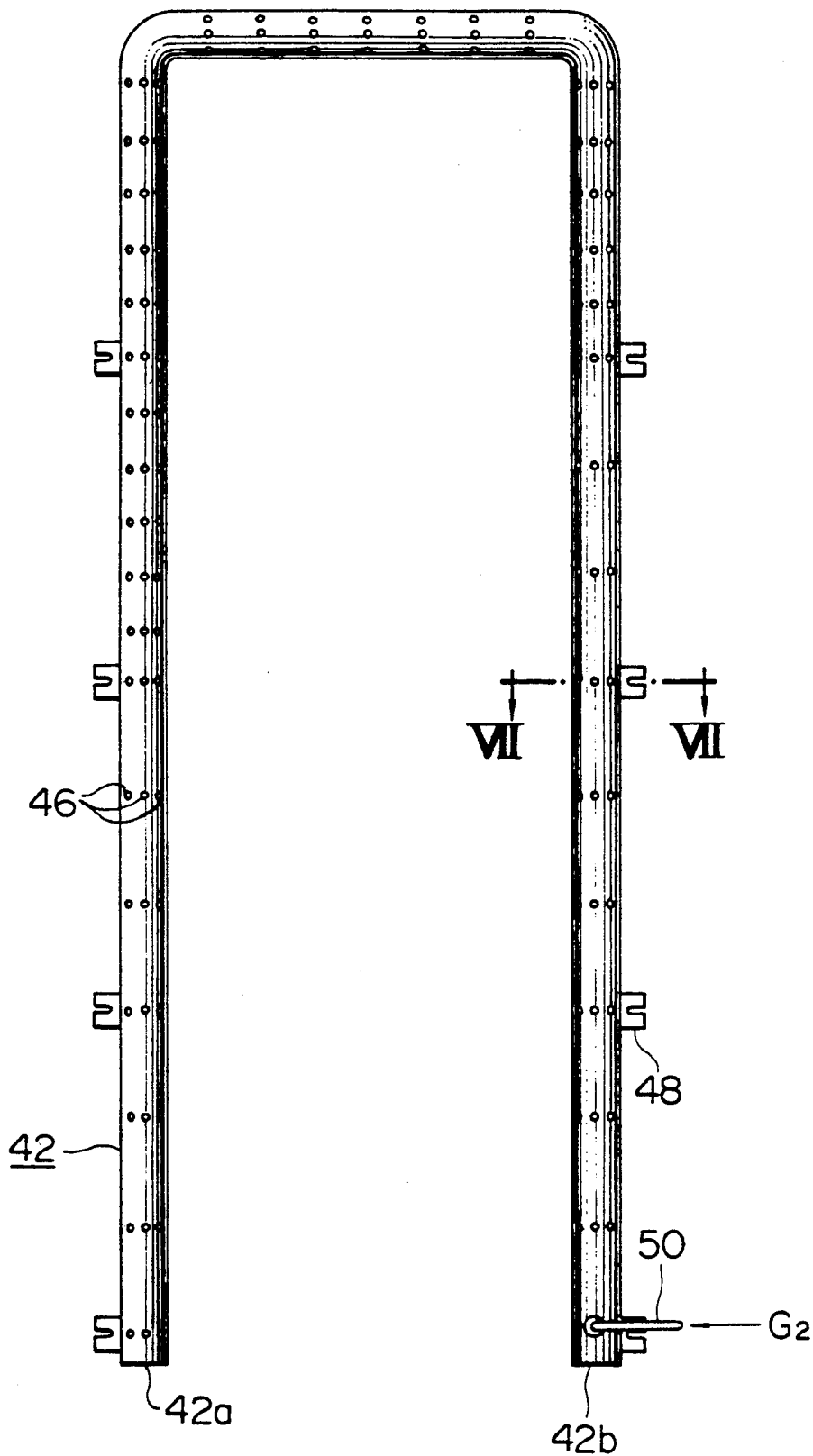
FIG. 6 is a plan view of a first embodiment of the nozzle unit shown in FIG. 4.

As shown in FIG. 6, the nozzle unit 42 according to a first embodiment is formed from a cylindrical pipe, in the shape of an inverted letter "U" along the angle of the side wall surface 8a of the load lock chamber 8. Furthermore, both of end portions 42a, 42b are closed and a plural number of gas emission openings 46 are formed at a required interval (such as 0.3 mm) around the periphery, and fixing legs 48 connect the pipe at constant intervals. In this embodiment, the density of formation of the gas emission openings 46 has a regularity. More specifically, the gas emission openings 46 are formed more densely on the side farthest from the upper portion side and the exhaust hole 32 (See FIG. 4) of the load lock chamber 8 and are formed less densely towards the bottom side. Furthermore, as shown in FIG. 6, a gas introduction pipe 50 connected at one end of the pipe, introduces the purge gas $G_2$ from a gas source external to the load lock chamber 8.

Figure 7:
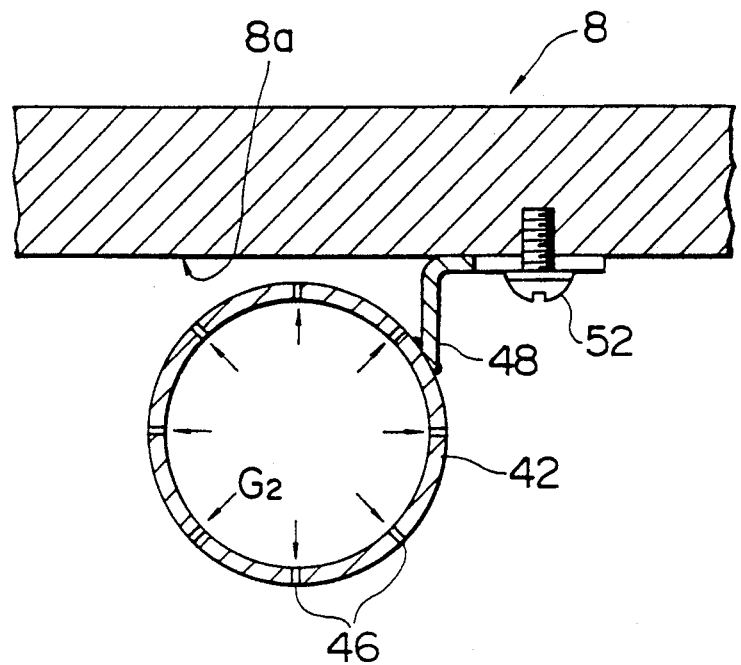
FIG. 7 is a perspective view along VII—VII of the nozzle unit shown in FIG. 6.

In addition, as shown in FIG. 7, the fixing legs 48 of the nozzle unit 42 are fixed by bolts 52 at constant intervals to the inner wall 8a of the load lock chamber 8. In this first embodiment, each of the gas emission openings 46 formed in the nozzle unit 42 are formed in the direction of the peripheral surface of the nozzle unit 42 which has a pipe shape, and so that the purge gas $G_2$ is emitted in a radial direction.

According to the configuration of this first embodiment, after the air inside the load lock chamber 8 has been exhausted from the exhaust tube 32, the purge gas $G_2$ supplied from the gas source can be uniformly supplied to inside the load lock chamber 8 via the nozzle unit 42. In this case, the nozzle unit 42 is provided to the corner portion of the inner wall surface 8a of the load lock chamber 8 and so it is possible for the purge gas $G_2$ to quickly purge the inside of the load lock chamber 8. In addition, the exhaust tube 32 is formed to the side of the rear surface of the boat elevator 22 which opposes the nozzle unit 42 and so the purge gas $G_2$ from the nozzle unit 42 is supplied uniformly with the semiconductor wafers 2 upstream and eddy currents in the vicinity of the semiconductor wafers 2 are prevented.

In addition, the three-dimensional space internal to the load lock chamber 8 is provided with the nozzle unit 42 at the corner portion of the inner wall surface 8a of the load lock chamber 8 and so the space for the movement of the boat elevator 22 is not obstructed and it is possible for the internal space of the load lock chamber 8 to be efficiently used.

Figure 8:
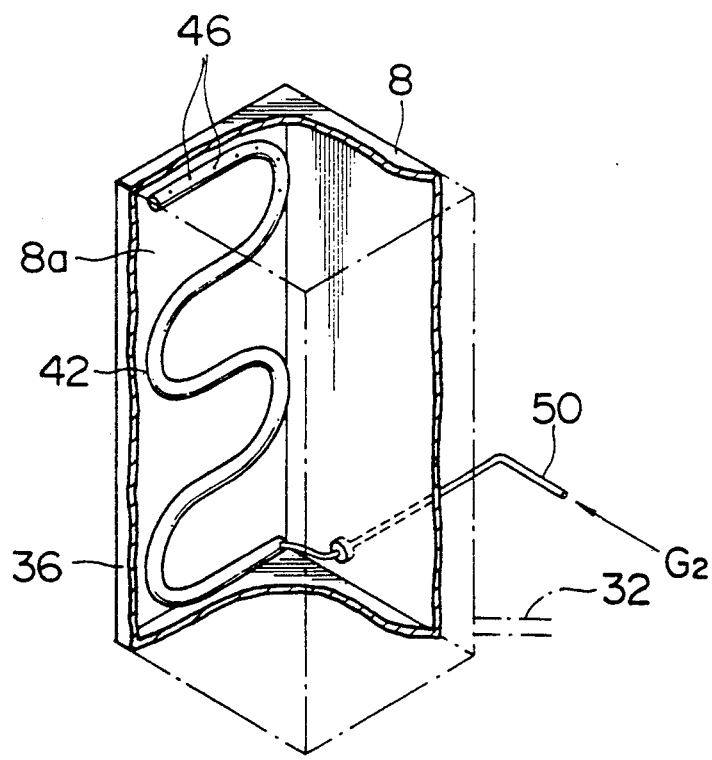
FIG. 8 is a partial sectional view showing a second embodiment of the nozzle unit.

FIG. 8 shows a second embodiment of the nozzle unit 42 of the heat treatment apparatus of the present invention. In the first embodiment, the nozzle unit 42 was formed of pipe having a "U" shape but in this second embodiment, the pipe is formed in a snake-shape having a plural number of bends, and with the many gas emission openings 46 on its surface. In this second embodiment as well, the density of formation of the gas emission openings 46 is densest approaching the portion farthest frame the exhaust tube 32 and is less dense towards the exhaust tube 32. This configuration produces the same effect as the first embodiment.

Figure 9:
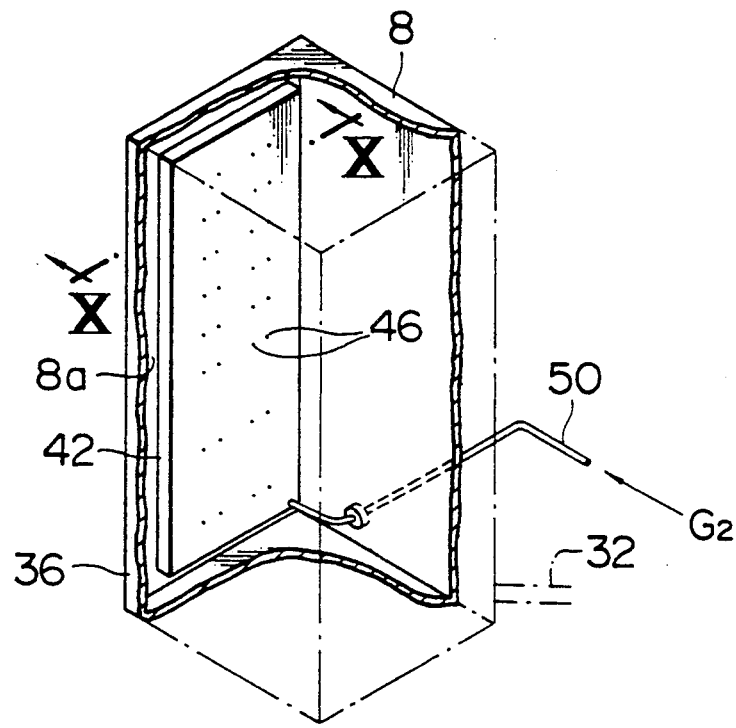
FIG. 9 is a partial sectional view showing a third embodiment of the nozzle unit.

FIG. 9 shows a third embodiment of the heat treatment apparatus of the present invention. The nozzle units 42 of the first and second embodiments were respectively formed in a "U" shape and a snake shape but in this third embodiment, the nozzle unit 42 is formed in a box shape corresponding to the shape of the inner wall surfaces of the load lock chamber 8 (and configured from SUS plate having a thickness of 1.5 mm, for example.)

Figure 10:
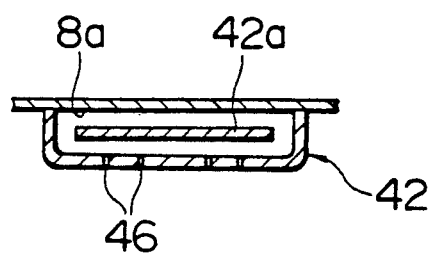
FIG. 10 is a perspective sectional view along X—X of the nozzle unit shown in FIG. 9.
Figure 11:
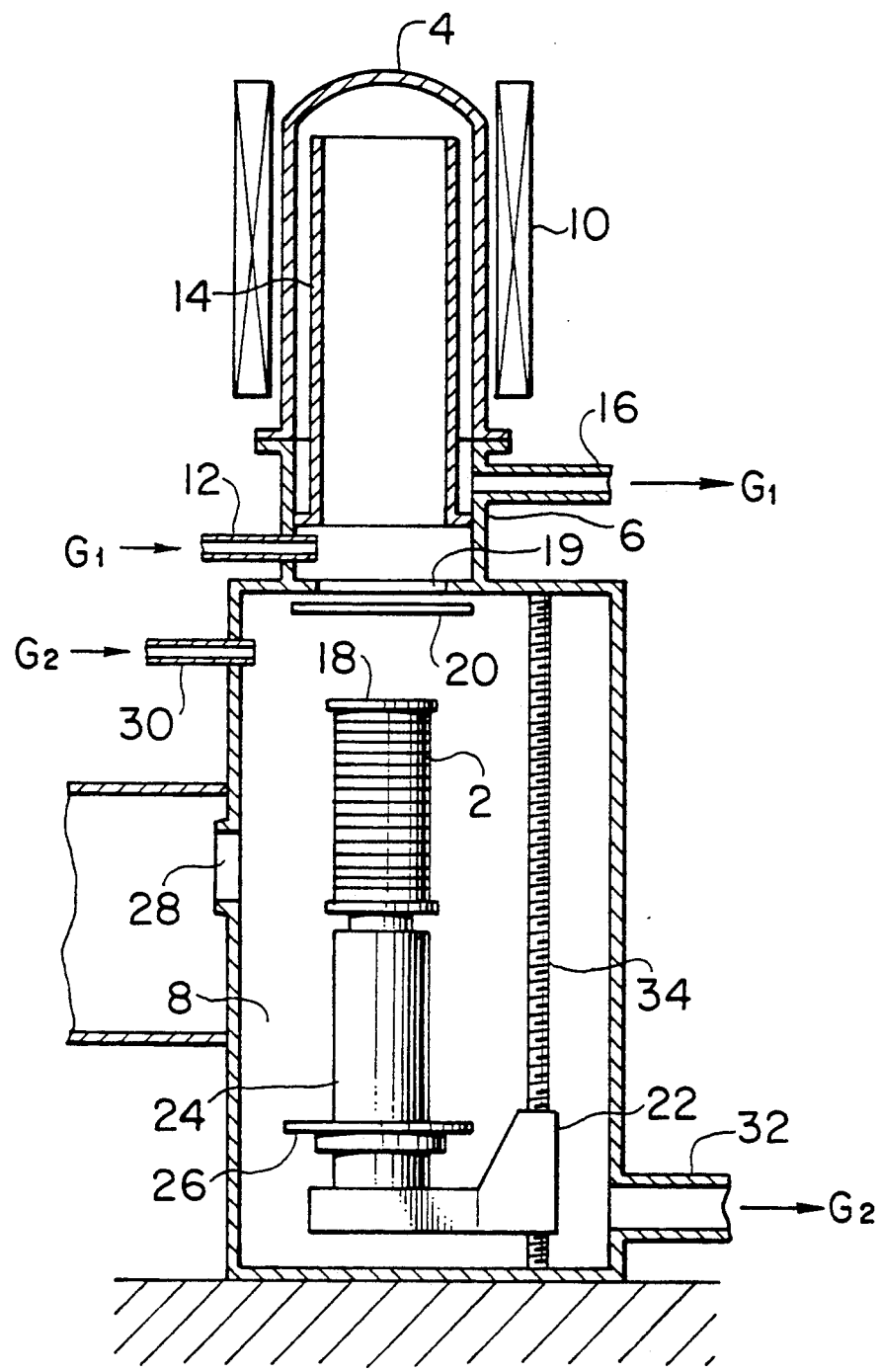
FIG. 11 is a longitudinal sectional view of a conventional heat treatment device.

Furthermore, as shown in FIG. 10, in this third embodiment, a baffle plate 42a is provided inside the box-shaped nozzle unit 42 and functions as a baffle to disperse the purge gas. In this third embodiment as well, the density of formation of the gas emission openings 46 is densest for the farthest from the exhaust tube 32 and least for closer to the nozzle unit 42. Such a configuration also provides the same effect as the configurations of the first and second embodiments.

As has been described above, the heat treatment apparatus of the present invention provides the following effects.

a. When compared to the conventional case were gas is supplied to the wafers from one point, it is possible to have faster and more uniform gas emission from the wall surface portion of the load lock chamber, it is possible to prevent the formation of unnecessary eddies and it is possible to protect the wafers from dust and the like, as well as have a good cooling effect. In addition, the inside of the load lock chamber is held in an oxygen-free status.

b. The nozzle unit is configured from a pipe provided with a plural number of gas emission openings and arranging it in the corner portion of an inner wall of the load lock chamber enables the need to have a compact processing space with a minimal volume to be met.

What is claimed is:

1. A heat treatment apparatus employing a process tube for heat treatment of an object to be heat treated, comprising:
    a load lock chamber linkable to a process tube for housing an object to be heat treated and capable of maintaining either a vacuum or an arbitrary inert gas atmosphere therein; and
    nozzle means for emitting gas over an entire height of a plurality of objects to be heat treated, said nozzle unit having a plural number of gas emission openings and being provided on an inner wall of said load lock chamber, thereby uniformly emitting gas to said object to be heat treated.

2. The heat treatment apparatus of claim 1, wherein said nozzle includes a "U"-shaped pipe with a plural number of gas emission openings.

3. The heat treatment apparatus of claim 1, wherein said nozzle means includes a zigzag shaped pipe with a plural number of gas emission openings.

4. The heat treatment apparatus of claim 1, wherein said nozzle means includes a box shaped member which corresponds to an inner wall surface of said load lock chamber, and is provided with a plural number of gas emission openings thereon.

5. The heat treatment apparatus of claim 1, wherein intervals of said plural number of gas emission openings provided to said nozzle means are arranged more densely at an upper portion of said load lock chamber, and less densely at a lower portion of said load lock chamber.

6. The heat treatment apparatus of claim 1, wherein an object to be treated is a semiconductor wafer.

7. The heat treatment apparatus of claim 9, wherein said loading apparatus for said object to be heat treated is a wafer boat.

8. The heat treatment apparatus of claim 1, wherein an object to be heat treated is housed in said load lock chamber after heat treating thereof.

9. The heat treatment apparatus of claim 1, further including a loading apparatus provided within said load lock chamber for carrying an object to be heat treated.

10. The heat treatment apparatus of claim 1, further including an elevator means provided within said load lock chamber for raising and lowering an object to be treated into and out of a process chamber.

11. The heat treatment apparatus of claim 10, wherein said nozzle means is provided on an inner wall of said load lock chamber at a side opposing said elevator means.

12. The heat treatment apparatus of claim 1, wherein said load lock chamber has a reflector provided therein, for directing flow of gas emitted from said nozzle means.

13. The heat treatment apparatus of claim 4, wherein said box shaped member has a baffle plate therein to disperse gas emitted by said nozzle means.

* * * * *